(12) United States Patent
Inaba et al.

(10) Patent No.: US 6,678,299 B1
(45) Date of Patent: Jan. 13, 2004

(54) SEMICONDUCTOR LASER APPARATUS

(75) Inventors: Yuichi Inaba, Osaka (JP); Masahiro Kito, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 120 days.

(21) Appl. No.: 09/587,588

(22) Filed: Jun. 2, 2000

(30) Foreign Application Priority Data

Jun. 2, 1999 (JP) .............................. 11-155006

(51) Int. Cl.$^7$ ................................. H01S 5/22
(52) U.S. Cl. ........................ 372/45; 372/46; 372/44
(58) Field of Search ........................ 372/39, 44, 45, 372/46, 40

(56) References Cited

U.S. PATENT DOCUMENTS 4,902,644 A * 2/1990 Wilt ........................ 437/129
5,717,710 A * 2/1998 Miyazaki et al. ............. 372/50
5,721,751 A 2/1998 Itaya et al. ..................... 372/46
5,847,415 A * 12/1998 Sakata .......................... 257/96

FOREIGN PATENT DOCUMENTS

JP 7-115251 5/1995

* cited by examiner

*Primary Examiner*—Paul Ip
*Assistant Examiner*—Jeffrey Zahn
(74) *Attorney, Agent, or Firm*—Snell & Wilmer, LLP

(57) ABSTRACT

The semiconductor laser device according to the present invention includes: a semiconductor substrate; an active layer having a stripe structure formed on the semiconductor substrate; and a buried layer formed on the semiconductor substrate and in a vicinity of the active layer, the buried layer including Fe and Ti.

16 Claims, 8 Drawing Sheets

US 6,678,299 B1

SEMICONDUCTOR LASER APPARATUS

BACKGROUND OF THE INVENTION

1. Field of the Invention

The present invention relates to a semiconductor laser device.

2. Description of the Related Art

A conventional semiconductor laser device 800 will be described with reference to FIGS. 8A through 8C.

FIGS. 8A and 8B are cross-sectional views illustrating a front end face and a rear end face of the conventional semiconductor laser device 800, respectively. FIG. 8C is a diagram illustrating a top plan view of a cross-section of the conventional semiconductor laser device 800, as taken along the X-Y line indicated in FIGS. 8A and 8B.

As shown in FIGS. 8A and 8B, the semiconductor laser device 800 includes: a semiconductor substrate 1 made of an n-type InP material and having a mesa structure; a light confinement layer 2 made of an n-type InGaAsP material (band-gap wavelength: about 1.05 $\mu$m) and having a thickness of about 600 nm; an active layer 3 having a multiple quantum-well structure: a light confinement layer 4 made of a p-type InGaAsP material and having a thickness of about 600 nm; and a cladding layer 5 made of a p-type InP material and having a thickness of about 400 nm. The layers 2 through 5 are provided in this order on the mesa region of the semiconductor substrate 1. The active layer 3 includes seven InGaAsP well layers (not shown) each having a thickness of about 6 nm and a compressive distortion of 1.0% or less, and seven InGaAsP (band-gap wavelength: about 1.05 $\mu$m) barrier layers (not shown) each having a thickness of about 10 nm and no compressive distortion, such that the InGaAsP well layers and the InGaAsP barrier layers are alternately layered on one another.

The semiconductor laser device 800 also includes: a first buried layer 6 made of a p-type InP material whose carrier density is $7.0 \times 10^{17}$ cm$^{-3}$, a second buried layer 7 made of an n-type InP whose carrier density is $2.0 \times 10^{18}$ cm$^{-3}$, a third buried layer 8 made of a p-type InP whose carrier density is $7.0 \times 10^{17}$ cm$^{-3}$, and a contact layer 9 made of a p-type InGaAsP (band-gap wavelength: about 1.3 $\mu$m). The layers 6 through 9 are provided in this order in the vicinity of the active layer 3. In order to achieve acceptable reverse I-V characteristics in the semiconductor laser device 800, the buried layers 6 through 8 are formed so as to have pnp-buried type different densities from one another.

In order to reduce the parasitic capacity in the buried layers 6 through 8 so as to improve the frequency response characteristics of the semiconductor laser device 800, grooves are provided around the stripe structure by using an etching technique. The grooves extend into the first buried layer 6.

On the contact layer 9, a SiO$_2$ film 10 is formed having a thickness of about 0.3 $\mu$m with an aperture therein. A metal multilayer film 11 including three layers (i.e., an Au layer, a Zn layer, and an Au layer) is formed in the aperture, and a p-type electrode 12 is formed on the metal multilayer film 11. An n-type electrode 13 is provided on the backside of the semiconductor substrate 1.

Referring to FIG. 8C, a top plan view of a cross-section of the active layer 3 of the semiconductor laser device 800 is shown. The active layer 3 has a width of about 0.6 $\mu$m in a region within about 25 $\mu$m from the front end face, while it has a width of about 1.6 $\mu$m in a region within about 25 $\mu$m from the rear end face. The distance between the front end face and the rear end face is about 400 $\mu$m, and the cross-section of the active layer 3 has a stripe structure. The width of the active layer 3 having this stripe structure continuously decreases from the rear end face toward the front end face. Thus, the stripe width of the active layer 3 at the front end face is narrower than that at the rear end face. This is a structure of a semiconductor laser device for implementing narrow output angle characteristics and low operation current characteristics at a high temperature (Y. Inaba et al., IEEE JSTQE, vol. 3, 1399–1404, 1997). With this structure, the effect of confining light within the active layer 3 continuously decreases from the rear end face toward the front end face. Therefore, a large amount of light leaks out of the active layer 3 into the first buried layers 6 in the region adjacent to the front end face. Moreover, light also leaks out of the active layer 3 into the third buried layer 8 because the light confinement layer 4 and the cladding layer 5 are thin.

FIG. 9 is a graph illustrating the relationship between an operation ambient temperature and an output angle of the conventional semiconductor laser device 800. As seen from FIG. 9, when the operation ambient temperature changes from about –40° C. to about 85° C., the output angle changes from about 14.0° to about 10.2° (i.e., by about 3.8°). Therefore, in a case where light output from the semiconductor laser device 800 is coupled to an optical fiber, for example, such temperature changes affect the coupling efficiency between the light from the semiconductor laser device 800 and the optical fiber, thereby affecting the intensity of the light propagated through the optical fiber. This will adversely affect the transmission characteristics of the optical fiber.

It is understood that the output angle changes because there exists about a 0.025 difference in the refractive index between the first buried layer 6 and the second buried layer 7, and between the third buried layer 8 and the second buried layer 7. This problem is especially prominent in a semiconductor laser device having an active layer with a small width (i.e., the stripe width is shorter in comparison with the wavelength) since a large amount of light leaks out of the active layer 3. The amount of change in the intensity of the light propagated through the optical fiber should satisfy the practical standards in optical communications (i.e., 1 dB or less for a temperature change of about –40° C. to about 85° C.). Otherwise, the transmission characteristics of the optical fiber would be very poor, and thus, the semiconductor laser device 800 might not be usable. The conventional semiconductor laser device 800 does not satisfy the above-mentioned practical standards since the amount of change in the intensity of the light propagated through the optical fiber is 2 dB.

As one type of conventional semiconductor laser device in which the active layer has a constant width with respect to the longitudinal cross-section of resonator, a semiconductor laser device is known which includes a single buried layer made of InP-based material doped with Fe (H. Taniwatari et. al., IEEE, JLT, vol. 15, 534 to 537). InP-based material doped with Fe, however, has a problem in that Fe diffuses into InP during a high-temperature operation. As a result, a current leak occurs and therefore it is difficult to achieve long-term reliability in such a semiconductor laser device.

In a conventional semiconductor laser device with pnp-type buried layers, such as the semiconductor laser device 800, the buried layers have different densities from one another. Therefore, the output angle of the beam changes depending on the amount of current applied to the laser and the temperature condition. As a result, it is difficult to achieve stable output angle characteristics.

SUMMARY OF THE INVENTION

In one aspect of the present invention, a semiconductor laser device includes: a semiconductor substrate; an active layer having a stripe structure formed on the semiconductor substrate; and a buried layer formed on the semiconductor substrate and in a vicinity of the active layer, the buried layer including Fe and Ti.

In one embodiment of the present invention, the buried layer includes InP.

In another embodiment of the present invention, the active layer has a width which is smaller than a diameter of a light emitting spot formed adjacent to the active layer.

In still another embodiment of the present invention, the width of the active layer is smaller at a front end face than at a rear end face.

In still another embodiment of the present invention, a diffraction lattice is formed on the semiconductor substrate.

In still another embodiment of the present invention, the semiconductor laser device further including an optical fiber provided at the front end face, light which has been output from the front end face being coupled into the optical fiber.

In one aspect of the present invention, a semiconductor laser device includes: a semiconductor substrate; an active layer having a stripe structure formed on the semiconductor substrate; and a buried layer formed on the semiconductor substrate and in a vicinity of the active layer, the buried layer including Rh.

In one embodiment of the present invention, the buried layer includes InP.

In another embodiment of the present invention, the active layer has a width which is smaller than a diameter of a light emitting spot formed adjacent to the active layer.

In still another embodiment of the present invention, the width of the active layer is smaller at a front end face than at a rear end face.

In still another embodiment of the present invention, a diffraction lattice is formed on the semiconductor substrate.

In still another embodiment of the present invention, the semiconductor laser device further including an optical fiber provided at the front end face, light which has been output from the front end face being coupled into the optical fiber.

In one aspect of the present invention, a semiconductor laser device includes: a semiconductor substrate; an active layer having a stripe structure formed on the semiconductor substrate; and a buried layer formed on the semiconductor substrate and in a vicinity of the active layer, the buried layer having a uniform refractive index, wherein a width of the active layer is smaller at a front end face than at a rear end face.

In one embodiment of the present invention, a diffraction lattice is formed on the semiconductor substrate.

In another embodiment of the present invention, an absorption layer is formed on the diffraction lattice.

In still another embodiment of the present invention, a semiconductor laser device further including an optical fiber provided at the front end face, light which has been output from the front end face being coupled into the optical fiber.

Thus, the invention described herein makes possible the advantages of providing a semiconductor laser device in which the output angle is less dependent on temperature and thus long-term reliability is improved.

A semiconductor laser device according to the present invention includes a semiconductor substrate, an active layer having a stripe structure formed on the semiconductor substrate, and a buried layer made of an InP-based material doped with Fe and Ti, and formed on the semiconductor substrate and in the vicinity of the active layer.

According to the present invention, excessive donors and acceptors compensate each other by the actions of Fe and Ti contained in the buried layer of the semiconductor laser device. Therefore, a thermally stabilizing effect is provided, whereby the current leak due to thermal diffusion of Fe is reduced.

If thermally stable Rh is used instead of Fe, doping of Ti is not necessary.

The semiconductor laser device according to the present invention includes a buried layer having a uniform density, and therefore the refractive index of the buried layer is uniform. Therefore, the change in the output angle caused by a temperature change is controlled so as to be low. The effect of the present invention becomes especially remarkable in a semiconductor laser device in which the width of the active layer is smaller than the diameter of a light emitting spot formed in the vicinity of the active layer.

These and other advantages of the present invention will become apparent to those skilled in the art upon reading and understanding the following detailed description with reference to the accompanying figures.

DESCRIPTION OF THE PREFERRED EMBODIMENTS

Referring to the attached drawings, an embodiment of the present invention will now be described.

Figure 1A:
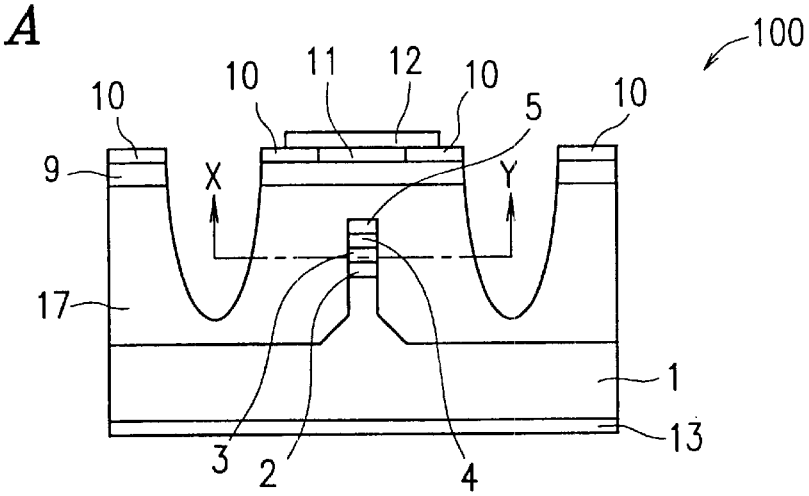
FIG. 1A is a cross-sectional view illustrating a front end face of a semiconductor laser device according to an embodiment of the present invention.
Figure 1B:
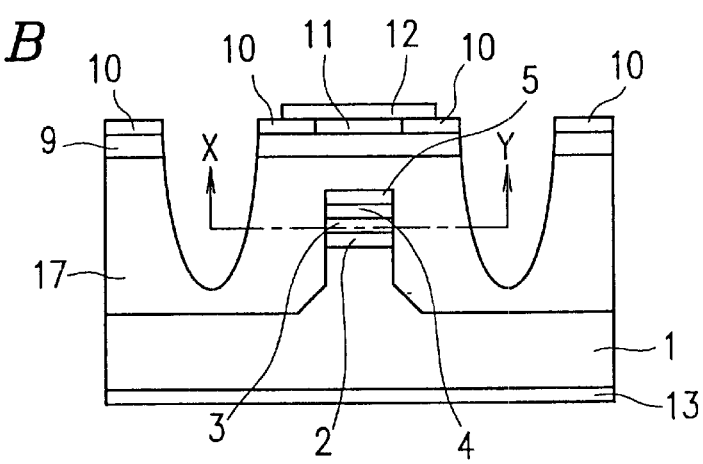
FIG. 1B is a cross-sectional view illustrating a rear end face of a semiconductor laser device in FIG. 1A.
Figure 1C:
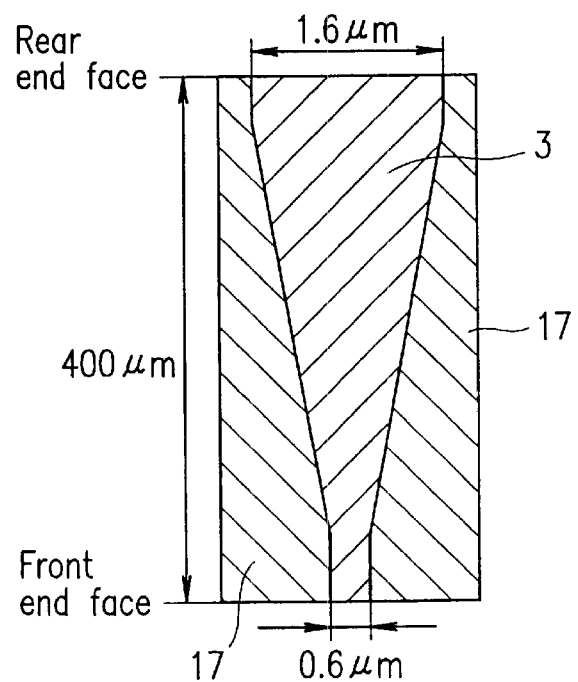
FIG. 1C is a diagram illustrating a top plan view of a cross-section of a semiconductor laser device of an embodiment of the present invention, as taken along the X-Y line indicated in FIGS. 1A and 1B.

FIGS. 1A and 1B are diagrams illustrating a front end face and a rear end face of a semiconductor laser device 100, respectively. FIG. 1C is a diagram illustrating a top plan view of a cross-section of the semiconductor laser device 100, as taken along the X-Y line indicated in FIGS. 1A and 1B. As shown in FIGS. 1A and 1B, the semiconductor laser device 100 includes: a semiconductor substrate 1 made of an n-type InP material and having a mesa structure; a light confinement layer 2, provided on a mesa region of the substrate 1, made of an n-type InGaAsP material (band-gap wavelength: about 1.05 μm) and having a thickness of about 600 nm; an active layer 3 having a multiple quantum-well structure; a light confinement layer 4 made of a p-type InGaAsP material and having a thickness of about 600 nm; and a cladding layer 5 made of a p-type InP material and having a thickness of about 400 nm. The layers 2 through 5 are provided in this order on the mesa region of the semiconductor substrate 1 by organic vapor phase epitaxy. These layers each have a mesa structure formed by wet etching.

The active layer 3 includes seven InGaAsP well layers (not shown) each having a thickness of about 6 nm and a compressive distortion of 1.0% or less, and seven InGaAsP (band-gap wavelength: about 1.05 μm) barrier layers (not shown) each having a thickness of about 10 nm and no compressive distortion, such that InGaAsP well layers and the InGaAsP barrier layers are alternately layered on one another. The oscillation frequency of the active layer 3 is about 1.3 μm.

Referring to FIG. 1C, a top plan view of a cross-section of the active layer 3 of the semiconductor laser device 100 is shown. The active layer 3 has a width of about 0.6 μm in a region within about 25 μm from the front end face, which is smaller than the diameter of a light emitting spot (about 1.0 μm) and therefore some of the light leaks out of the active layer 3. Note that the diameter of the light emitting spot is determined as a function of the oscillation wavelength of the semiconductor laser device. The active layer 3 has a width of about 1.6 μm in a region within about 25 μm from the rear end face. The distance between the front end face and the rear end face is about 400 μm, and the cross-section of the active layer 3 has a stripe structure. The width of the active layer 3 having this stripe structure continuously decreases from the rear end face toward the front end face. Thus, the stripe width of the active layer 3 at the front end face is narrower than that at the rear end face.

The semiconductor laser device 100 also includes: a buried layer 17 made of InP-based material doped with Fe at a density of $5.0 \times 10^{16}$ cm$^{-3}$ and Ti at a density of $2.0 \times 10^{16}$ cm$^{-3}$ on the semiconductor substrate and in the vicinity of the active layer 3. The buried layer 17 is highly resistive and thus has a current blocking function. The buried layer 17 is thermally stable since it contains Ti, whereby a leak current flowing in the buried layer 17 is reduced. This effect is achieved regardless of the width of the active layer 3.

On the buried layer 17, a contact layer 9, which is made of p-type InGaAsP material (band-gap wavelength: about 1.3 μm) is formed.

In order to reduce the parasitic capacitance in the buried layers 17 so as to improve the frequency response characteristics of the semiconductor laser device 100, grooves are provided by etching the periphery of the mesa stripe structure.

On the contact layer 9, a SiO$_2$ film 10 is formed having a thickness of about 0.3 μm with an aperture therein. A metal multilayer film 11 including three layers (i.e., an Au layer, a Zn layer, and an Au layer) is formed in the aperture, and a p-type electrode 12 containing a Ti layer and an Au layer (not shown) in this order is formed on the metal multilayer film 11. An n-type electrode 13 is provided on the back side of the semiconductor substrate 1 by depositing an Au layer, an Sn layer, a CR layer, a Pt layer, and an Au layer (not shown) in this order.

Figure 2:
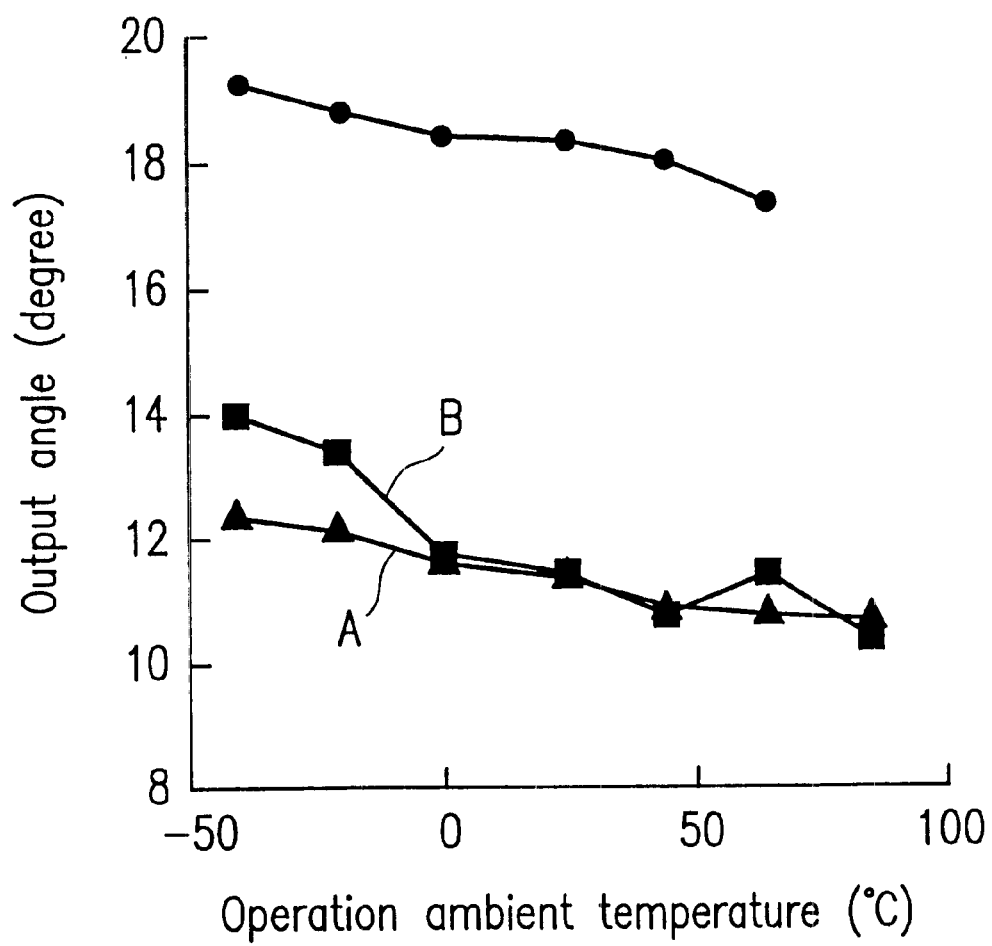
FIG. 2 is a graph illustrating a relationship between an operation ambient temperature and an output angle of a semiconductor laser device according to the present invention.
Figure 9:
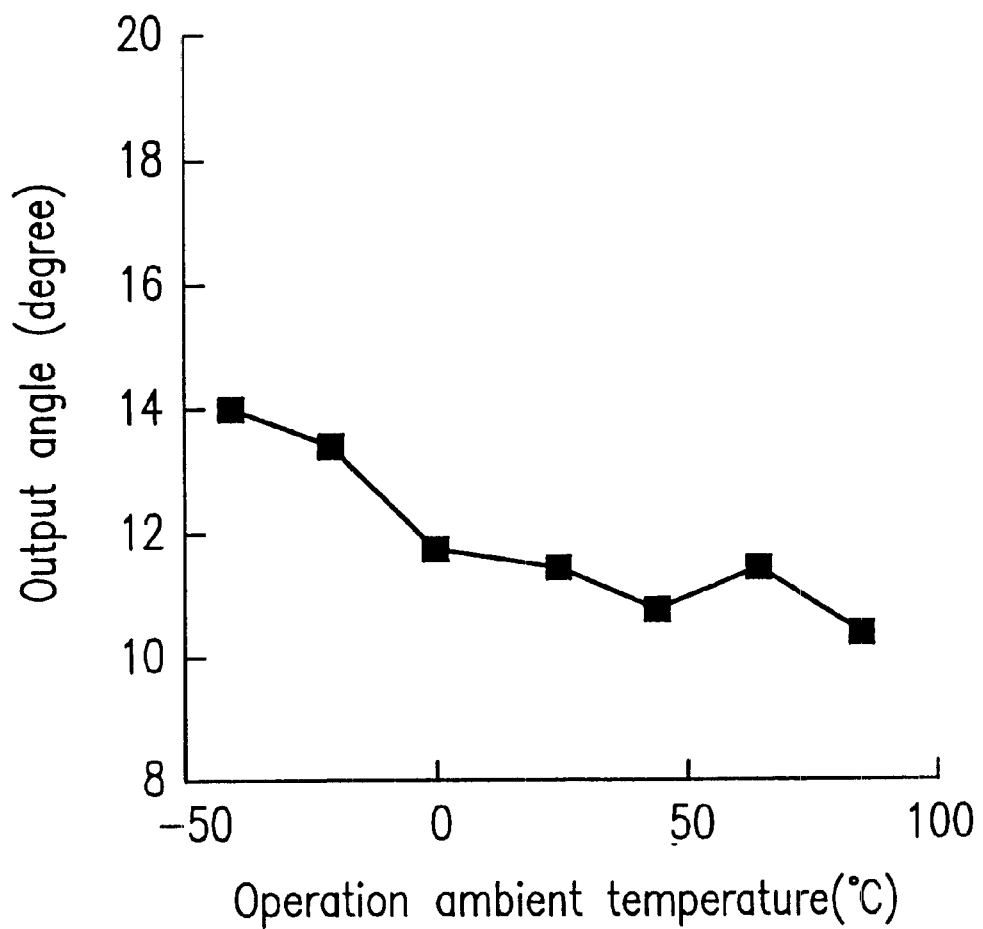
FIG. 9 is a graph illustrating a relationship between an operation ambient temperature and an output angle of a conventional semiconductor laser device.

FIG. 2 is a graph illustrating a relationship between an operation ambient temperature and an output angle of the semiconductor laser device 100 according to this embodiment of the present invention (line A). For comparison, the graph also shows a relationship between an operation ambient temperature and an output angle of the conventional semiconductor laser device 800 shown in FIG. 9 (line B). As seen from line A, when the operation ambient temperature of the semiconductor laser device 100 according to this embodiment of the present invention changes from about −40° C. to about 85° C., the output angle changes from about 12.3° to about 10.8°, that is, the change in the output angle is reduced to about 1.5° according to the present invention. This change in the output angle is considerably small compared to the about 3.8° change in the conventional example. Accordingly, by forming the buried layer 17 from a material having a uniform refractive index, the temperature dependency of the output angle can be reduced in a semiconductor laser device in which the width of the active layer 3 at the front end face is narrower than that at the rear end face. This is because in the semiconductor laser device 100, the refractive index of the buried layer 17 is uniform, and thus the dependency of the output angle on the amount of current applied to the laser and/or on the ambient temperature can be reduced.

Figure 3:
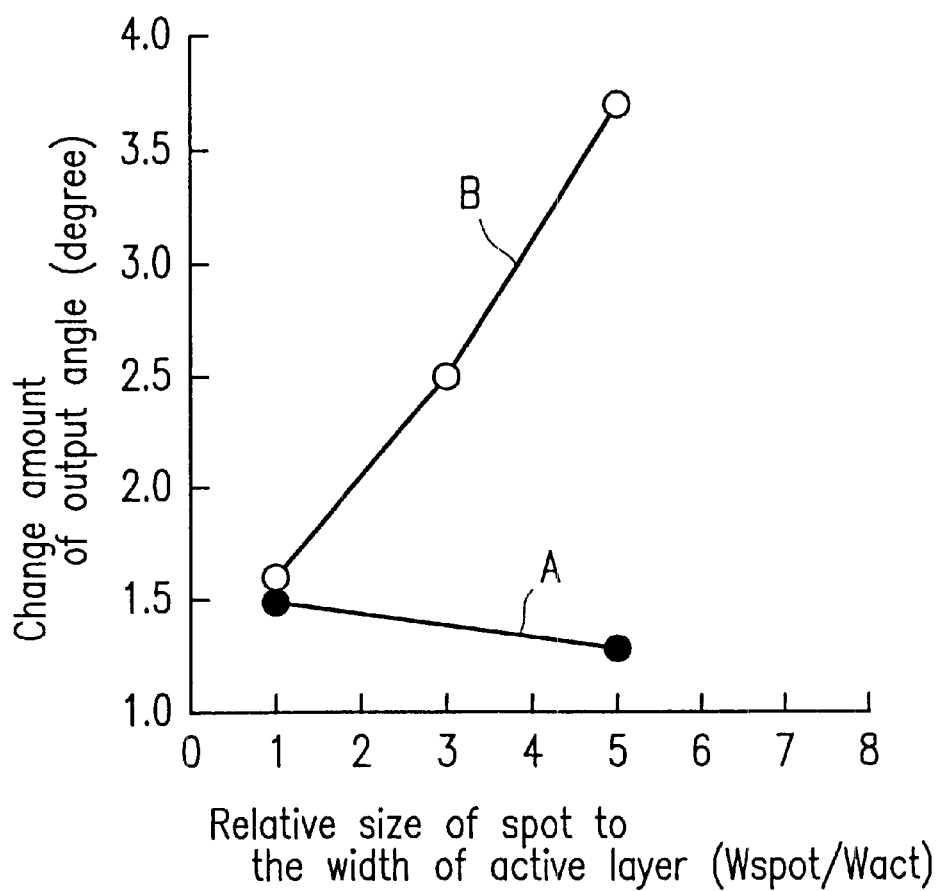
FIG. 3 is a graph illustrating a relationship between a relative size of a light emitting spot to a width of the active layer and a change in the output angle of the semiconductor laser device according to the present invention, between the temperature range of −40° C. to 85° C.

FIG. 3 is a graph illustrating a relationship between a value of Wspot/Wact (where Wact is the width of the active layer, and Wspot is the diameter of the light emitting spot) and the change in the output angle caused by a temperature change of the semiconductor laser device 100 according to the present invention (line A). The temperature range is between −40° C. to 85° C. For comparison, the graph also shows a relationship between a value of Wspot/Wact and the change in an output angle of the conventional semiconductor laser device 800 (line B).

As can be seen from FIG. 3, when Wspot/Wact is 1, the change in the output angle is about 1.5° on either line A or line B. When Wspot/Wact is 5, however, the change in the output angle for the semiconductor laser device 100 of the present embodiment (line A) is reduced to about 1.3° while it is about 3.8° in the conventional example (line B).

Figure 4:
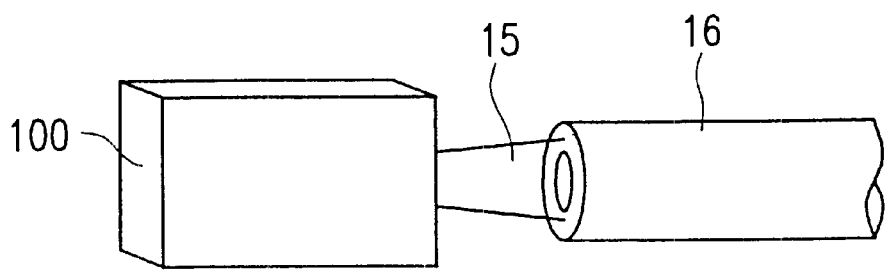
FIG. 4 is a schematic view illustrating an optical system for inputting laser light, which has been output from the semiconductor laser device according to the present invention, into an optical fiber.

FIG. 4 is a schematic view illustrating an optical system for coupling laser light 15, which has been output from the semiconductor laser device 100 according to the present invention, into an optical fiber 16.

With reference to FIG. 4, no optical elements for collecting light (e.g. lenses) are provided between the semiconductor laser device 100 and the optical fiber 16. The laser light 15 can not effectively enter the optical fiber 16 in the case where the output angle of the laser light 15 is large. If the buried layer 17 is formed of InP-based material doped with Fe and Ti, the output angle of the laser light 15 varies as the temperature changes, and then the intensity of light entering the optical fiber 16 also changes accordingly.

Figure 5:
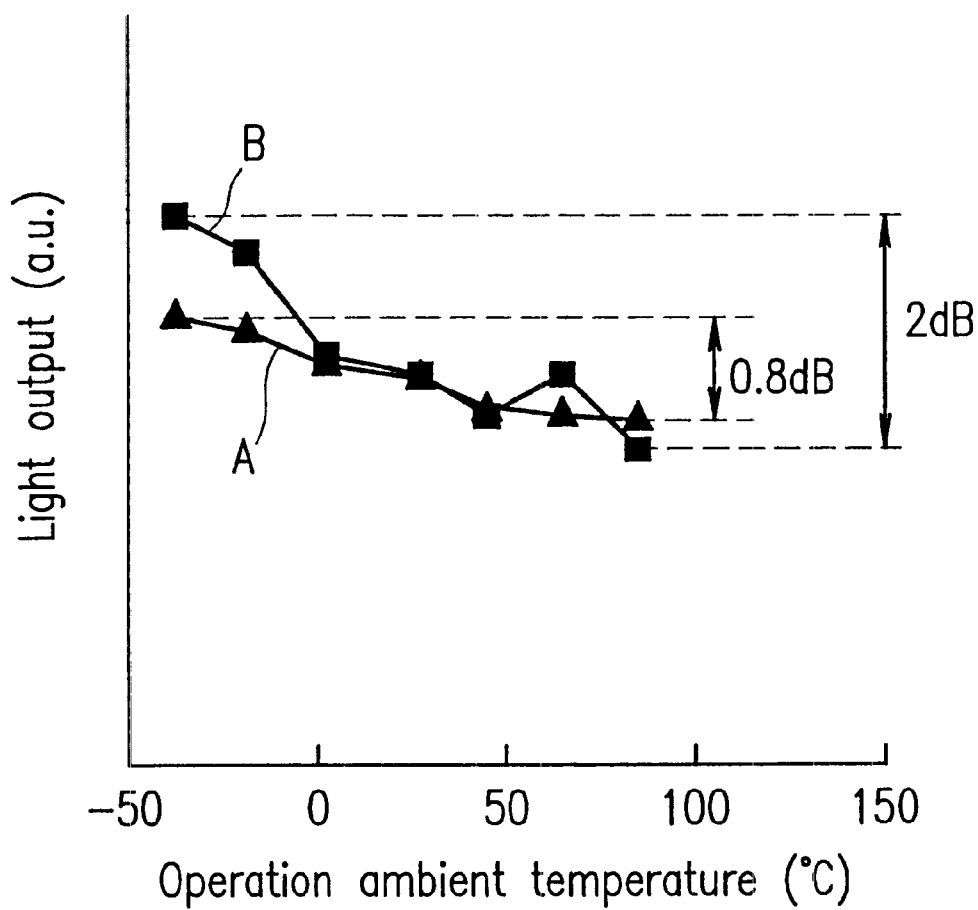
FIG. 5 is a graph illustrating a relationship between an operation ambient temperature and an intensity of light entering an optical fiber.

FIG. 5 is a graph illustrating a relationship between an operation ambient temperature of the semiconductor laser device 100 and an intensity of the light entering the optical fiber 16 (line A). For comparison, the graph also shows a relationship between an operation ambient temperature of the conventional semiconductor laser device 800 and an intensity of the light entering the optical fiber 16 (line B).

As can be seen from line A, according to the semiconductor laser device 100 of the present embodiment, even if the operational ambient temperature changes from about −40° C. to about 85° C., the range of the change in the intensity of the light entering the optical fiber 16 is reduced to about 0.8 dB while the range in the conventional example is about 2 dB. This change in output angle satisfies the aforementioned practical standards in optical communications (i.e., 1 dB or less). Therefore, according to the semiconductor laser device 100, no optical elements for collecting light (e.g., lens) are required between the semiconductor laser device 100 and the optical fiber 16, and thus the total number of elements in the entire device may be reduced.

According to the semiconductor laser device 100 of the present embodiment, the buried layer 17 is made of InP doped with Fe and Ti, whereby the resistivity of the buried layer 17 will be on the order of $10^7 \Omega \cdot cm$ and the diffusion of the doping material is significantly small with respect to the ambient temperature. As a result, a high stability against temperature changes is achieved.

Alternatively, similar characteristics can be obtained by using InP doped with Rh as a material for the buried layer 17. Since the diffusion of Rh into InP is significantly small in comparison with that of Fe and Ti into InP, the stability against temperature changes is further improved. As a result, the change in the output angle due to a temperature change is suppressed in an even broader temperature range.

Furthermore, similar effects can be achieved by arranging the semiconductor laser device 100 so as to have a transmission frequency bandwidth of 1.3 μm, 1.55 μm or any other applicable frequency bandwidth.

Figure 6A:
FIG. 6A is a diagram illustrating a semiconductor substrate provided with a diffraction lattice.
Figure 6B:
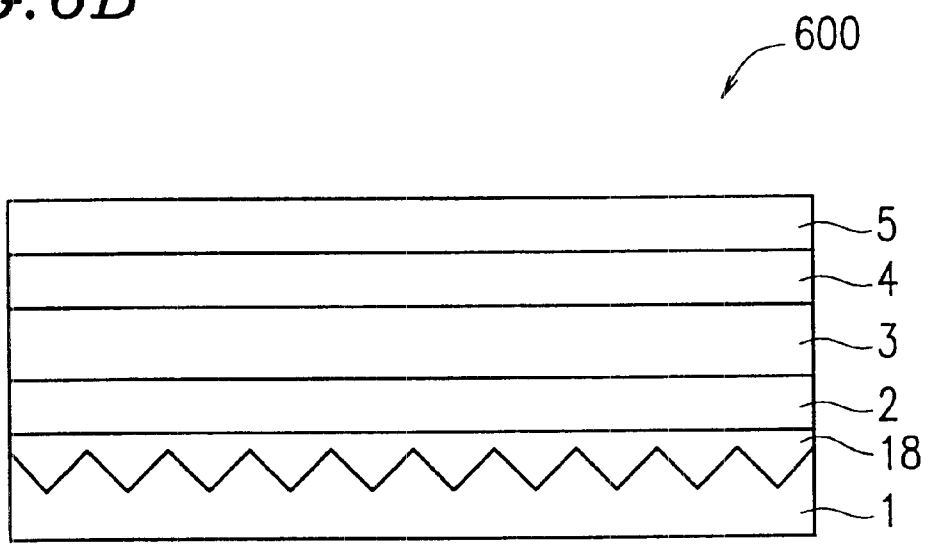
FIG. 6B is an enlarged view of a longitudinal cross-section of a mesa region of a semiconductor laser device incorporating the semiconductor substrate shown in FIG. 6A, where a refractive index-coupling function is imparted to the semiconductor laser device.

FIG. 6A illustrates the semiconductor substrate 1' with a diffraction lattice structure provided thereon, and FIG. 6B is an enlarged view of a longitudinal cross-section of a mesa region 600 of a distribution feedback semiconductor laser device incorporating the semiconductor substrate 1' shown in FIG. 6A, which is imparted with a refractive index coupling function. It is preferable to provide an effective refractive index modulation layer 18 on the semiconductor substrate 1', and then form a light confinement layer 2, an active layer 3, a light confinement layer 4, and a cladding layer 5 in this order. By providing a diffraction lattice on the surface of the semiconductor substrate 1' shown in FIG. 6A by forming a plurality of grooves perpendicular to the resonance direction of light, a refractive index coupling function can be imparted to the distribution feedback (DFB) semiconductor laser device. The wavelength selection properties of the diffraction lattice make it possible to achieve a single wavelength operation of the semiconductor laser device, whereby high speed, large capacity communication is made possible.

Figure 7A:
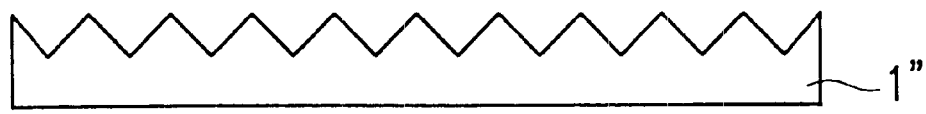
FIG. 7A is a diagram illustrating another semiconductor substrate provided with a diffraction lattice.
Figure 7B:
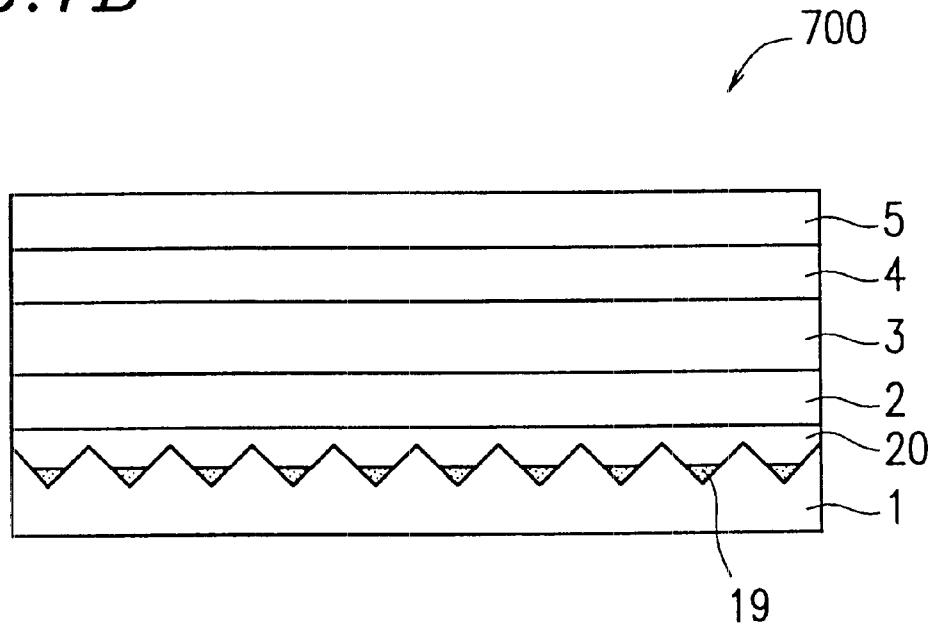
FIG. 7B is an enlarged view of a longitudinal cross-section of a mesa region of a semiconductor laser device incorporating the semiconductor substrate shown in FIG. 7A, where an gain-coupling function is imparted to the semiconductor laser device.
Figure 8A:
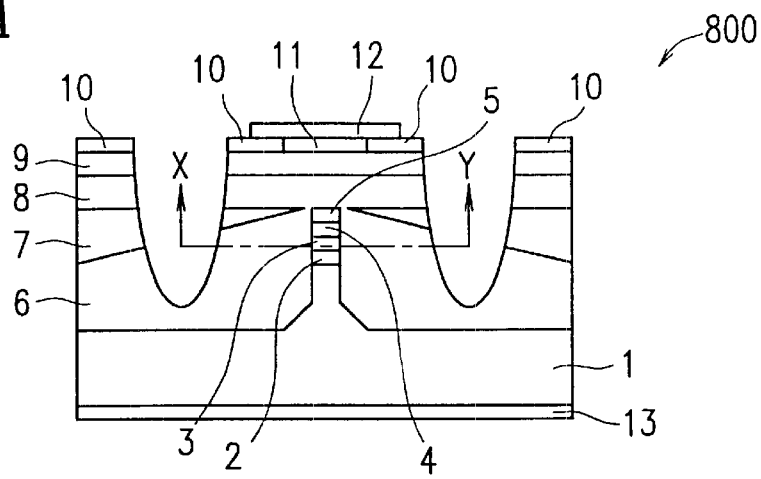
FIG. 8A is a cross-sectional view illustrating a front end face of a conventional semiconductor laser device.
Figure 8B:
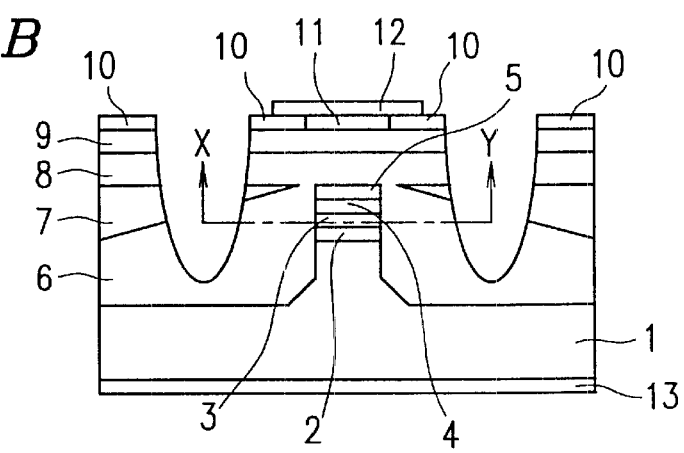
FIG. 8B is a cross-sectional view illustrating a rear end face of a conventional semiconductor laser device.
Figure 8C:
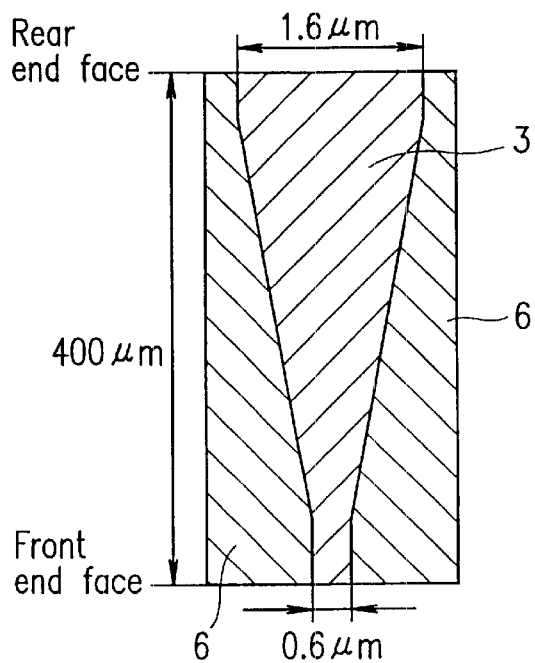
FIG. 8C is a diagram illustrating a top plan view of a cross-section of a conventional semiconductor laser device, as taken along the X-Y line indicated in FIGS. 8A and 8B.

FIG. 7A illustrates the semiconductor substrate 1" provided with a diffraction lattice, and FIG. 7B is an enlarged view of a longitudinal cross-section of a mesa region 700 of a distribution feedback semiconductor laser device incorporating the semiconductor substrate 1" shown in FIG. 7A, which is imparted with a gain coupling function. An absorption layer 19 is provided in the grooves of the diffraction lattice structure of the semiconductor substrate 1", and an InP buffer layer 20 is provided on the absorption layer 19. On the InP buffer layer 20, a light confinement layer 2, an active layer 3, a light confinement layer 4, and a cladding layer 5 are provided in this order. By providing a diffraction lattice formed on the surface of the semiconductor substrate 1" as shown in FIG. 7A by a similar method to that used for the semiconductor substrate 1' in FIG. 6A, and by providing a light absorption material made of InAsP in the grooves of the diffraction lattice, a distribution feedback semiconductor laser device with a gain coupling function can be produced. As a result, the influence of reflectance at the end faces is reduced, whereby the yield of the semiconductor laser device is increased.

The semiconductor laser device according to the present invention includes a semiconductor substrate, an active layer having a stripe structure formed on the semiconductor substrate, and a buried layer made of InP doped with Fe and Ti. The buried layer is formed on the semiconductor substrate and in a vicinity of the active layer. This structure provides a semiconductor laser device which is thermally stable and therefore the change in the output angle due to a temperature change is reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device, comprising:
   a first electrode having a first conductivity type;
   a semiconductor substrate disposed on the first electrode;
   a first light confinement layer, an active layer having a stripe structure, a second light confinement layer, and a cladding layer formed on the semiconductor substrate in this order;
   a buried layer formed on the semiconductor substrate so as to bury the stripe structure, the buried layer confining a light emitted by the active layer within the active layer, the buried layer comprising Fe and Ti, wherein the buried layer is doped with Ti at the extent enough to prevent the heat diffusion of Fe from the buried layer; and
   a second electrode having a second conductivity type formed on the buried layer.

2. A semiconductor laser device according to claim 1, wherein the buried layer comprises InP.

3. A semiconductor laser device according to claim 1, wherein the active layer has a width which is smaller than a diameter of a light emitting spot formed adjacent to the active layer.

4. A semiconductor laser device according to claim 1, wherein the width of the active layer is smaller at a front end face than at a rear end face.

5. A semiconductor laser device according to claim 1, wherein a diffraction lattice is formed on the semiconductor substrate.

6. A semiconductor laser device according to claim 1, further comprising an optical fiber provided at the front end face, light which has been output from the front end face being coupled into the optical fiber.

7. A semiconductor laser device, comprising:
 a first electrode having a first conductivity type;
 a semiconductor substrate disposed on the first electrode;
 a first light confinement layer, an active layer having a stripe structure, a second light confinement layer, and a cladding layer formed on the semiconductor substrate in this order;
 a buried layer formed on the semiconductor substrate so as to bury the first light confinement layer, the active layer, the second light confinement layer, and the cladding layer, the buried layer confining a light emitted by the active layer within the active layer, the buried layer comprising Rh, wherein a diffusion coefficient of Rh is smaller than the diffusion coefficients of Fe and Ti; and
 a second electrode having a second conductivity type formed on the buried layer.

8. A semiconductor laser device according to claim 7, wherein the buried layer comprises InP.

9. A semiconductor laser device according to claim 7, wherein the active layer has a width which is smaller than a diameter of a light emitting spot formed adjacent to the active layer.

10. A semiconductor laser device according to claim 7, wherein the width of the active layer is smaller at a front end face than at a rear end face.

11. A semiconductor laser device according to claim 7, wherein a diffraction lattice is formed on the semiconductor substrate.

12. A semiconductor laser device according to claim 7, further comprising an optical fiber provided at the front end face, light which has been output from the front end face being coupled into the optical fiber.

13. A semiconductor laser device, comprising:
 a first electrode having a first conductivity type;
 a semiconductor substrate disposed on the first electrode;
 a first light confinement layer, an active layer having a stripe structure, a second light confinement layer, and a cladding layer formed on the semiconductor substrate in this order;
 a buried layer formed on the semiconductor substrate so as to bury the the stripe structure, the buried layer confining a light emitted by the active layer within the active layer, the buried layer having a uniform refractive index and being uniform against heat; and
 a second electrode having a second conductivity type formed on the buried layer,
wherein a width of the active layer is smaller at a front end face than at a rear end face.

14. A semiconductor laser device according to claim 13, wherein a diffraction lattice is formed on the semiconductor substrate.

15. A semiconductor laser device according to claim 14, wherein an absorption layer is formed on the diffraction lattice.

16. A semiconductor laser device according to claim 13, further comprising an optical fiber provided at the front end face, light which has been output from the front end face being coupled into the optical fiber.

* * * * *